US009135852B2

(12) United States Patent
Kwon et al.

(10) Patent No.: US 9,135,852 B2
(45) Date of Patent: Sep. 15, 2015

(54) ORGANIC LIGHT EMITTING DIODE DISPLAY (71) Applicant: SAMSUNG DISPLAY CO., LTD., Yongin, Gyeonggi-Do (KR)

(72) Inventors: Do-Hyun Kwon, Yongin (KR); Il-Jeong Lee, Yongin (KR); Choong-Youl Im, Yongin (KR); Ju-Won Yoon, Yongin (KR); Moo-Soon Ko, Yongin (KR); Min-Woo Woo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/029,865

(22) Filed: Sep. 18, 2013

(65) Prior Publication Data

US 2014/0332768 A1 Nov. 13, 2014

(30) Foreign Application Priority Data

May 9, 2013 (KR) ........................ 10-2013-0052585

(51) Int. Cl.
*H01L 51/05* (2006.01)
*B82Y 10/00* (2011.01)
*G09G 3/32* (2006.01)
*H01L 27/32* (2006.01)

(52) U.S. Cl.
CPC ................ *G09G 3/32* (2013.01); *H01L 27/326* (2013.01); *H01L 27/3276* (2013.01); *H01L 2227/323* (2013.01)

(58) Field of Classification Search
CPC ............ H01L 51/0545; H01L 51/0036; H01L 51/0541; H01L 51/5012; B82Y 10/00
USPC ......................................... 257/40; 438/82, 99
See application file for complete search history.

(56) References Cited

U.S. PATENT DOCUMENTS

| 2007/0188089 | A1* | 8/2007 | Choi et al. .................... 313/506 |
| 2008/0246033 | A1* | 10/2008 | Huh et al. ........................ 257/59 |
| 2008/0251786 | A1* | 10/2008 | Choi et al. ..................... 257/40 |
| 2009/0128018 | A1* | 5/2009 | Lee ............................... 313/504 |
| 2009/0302319 | A1* | 12/2009 | Cho et al. ........................ 257/59 |
| 2010/0025664 | A1* | 2/2010 | Park ............................... 257/40 |
| 2012/0080681 | A1* | 4/2012 | Kim et al. ........................ 257/59 |
| 2012/0098008 | A1* | 4/2012 | Song et al. ...................... 257/98 |
| 2012/0098415 | A1* | 4/2012 | Song et al. ................... 313/504 |

FOREIGN PATENT DOCUMENTS

| KR | 10-2005-0099713 A | 10/2005 |
| KR | 10-2009-0050765 A | 5/2009 |

* cited by examiner

*Primary Examiner* — Steven Loke
*Assistant Examiner* — Didarul Mazumder
(74) *Attorney, Agent, or Firm* — Lee & Morse, P.C.

(57) ABSTRACT

A display includes a switching transistor connected to a scan line and data line, a driving transistor connected to the switching transistor, a storage capacitor between a voltage line and the driving transistor, and an organic light emitting diode connected to the driving transistor. The data line and voltage line are at different layers, and the data line and a gate electrode of the driving transistor are at different layers. Also, a plate of the storage capacitor and the gate electrode of the driving transistor are of a same layer, and semiconductor layers of the switching and driving transistors are of a same layer.

17 Claims, 9 Drawing Sheets

ORGANIC LIGHT EMITTING DIODE DISPLAY

CROSS-REFERENCE TO RELATED APPLICATION

Korean Patent Application No. 10-2013-0052585, filed on May 9, 2013, and entitled: "Organic Light Emitting Diode Display," is incorporated by reference herein in its entirety.

BACKGROUND

1. Field

Embodiments described herein relate to an organic light emitting diode display.

2. Description of the Related Art

An organic light emitting diode display (OLED) includes a plurality of pixels, each including an organic emission layer between an anode and cathode. When electrons from the cathode and holes from the anode combine in the organic emission layer, excitons are formed to emit light in an image.

The light from each pixel diode may correspond to a grayscale value lying in a range from black to white, as determined by a driving current in a pixel control circuit. The higher the resolution of the display, the lower the size and amount of current flowing in each pixel. Thus, at higher resolutions, a driving range of gate voltages applied to switching and driving transistors in the pixel control circuit becomes small.

The small pixel size and driving current present challenges to display designers. For example, it may be difficult to adjust the magnitude of the gate voltage applied to the driving transistor to ensure a sufficient range of grayscale values. Also, because of the reduced size of each pixel, it may be difficult to form a storage capacitor and a driving voltage line and a data line with a same layer.

SUMMARY

In accordance with on embodiment, an organic light emitting diode display includes a substrate; a scan line on the substrate to transmit a scan signal; a data line and a driving voltage line crossing the scan line, the data line and driving voltage line to respectively transmit a data signal and a driving voltage; a switching transistor connected to the scan line and the data line and including a semiconductor layer, a gate electrode, and a drain electrode; a driving transistor connected to the drain electrode of the switching transistor and including a semiconductor layer and a gate electrode; and an organic light emitting diode connected to the drain electrode of the driving transistor The data line and the driving voltage line are at different layers, and the data line and the gate electrode of the driving transistor are at different layers.

Also, the gate electrode of the driving transistor and the gate electrode of the switching transistor may be at different layers.

Also, a first gate insulating layer may be over the semiconductor layers of the driving and switching transistors; and a second gate insulating layer may be on the first gate insulating layer and over the gate electrode of the switching transistor, and the gate electrode of the driving transistor may be on the second gate insulating layer.

Also, a first interlayer insulating layer may be over the gate electrode of the driving transistor; and a second interlayer insulating layer may be over the data line formed on the first interlayer insulating layer, wherein the driving voltage line is formed on the second interlayer insulating layer.

Also, a storage capacitor including a first plate may be formed of a same layer as the gate electrode of the switching transistor and a second plate may be on the second gate insulating layer over the first plate, and the driving voltage line may be connected to the second plate.

Also, the second gate insulating layer may include a high dielectric constant material such as one selected from HfOx, ZrOx, AlOx, and SiOx. The second plate may be formed of a same material and is of a same layer as the gate electrode of the driving transistor.

In accordance with another embodiment, an organic light emitting diode display includes a substrate; a scan line on the substrate to transmit a scan signal; a data line and a driving voltage line crossing the scan line, the data line and driving voltage line to respectively transmit a data signal and a driving voltage; a switching transistor connected to the scan line and the data line and including a semiconductor layer and a gate electrode and a drain electrode; a driving transistor connected to the drain electrode of the switching transistor and including a semiconductor layer and a gate electrode; and an organic light emitting diode connected to the drain electrode of the driving transistor. The data line and the driving voltage line are at different layers, and the data line and the driving gate electrode are at a same layer.

Also, the gate electrode of the driving transistor may be at a different layer from the gate electrode of the switching transistor.

Also, a first gate insulating layer may be over a semiconductor layer including the semiconductor layers of the switching and driving transistors; and a second gate insulating layer may be on the first gate insulating layer and over the gate electrode of the switching transistor, and the gate electrode of the driving transistor may be on the second gate insulating layer.

Also, an interlayer insulating layer may be over the gate electrode of the driving transistor and the data line, and the driving voltage line may be on the interlayer insulating layer.

Also, a storage capacitor including a first plate may be formed of a same layer as the gate electrode of the switching transistor and a second plate on the second gate insulating layer may be over the first plate, wherein the driving voltage line is connected to the second plate.

Also, the second gate insulating layer includes a high dielectric constant material such as one selected from HfOx, ZrOx, AlOx, and SiOx. The second plate may be formed of a same material and is of a same layer as the gate electrode of the driving transistor.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
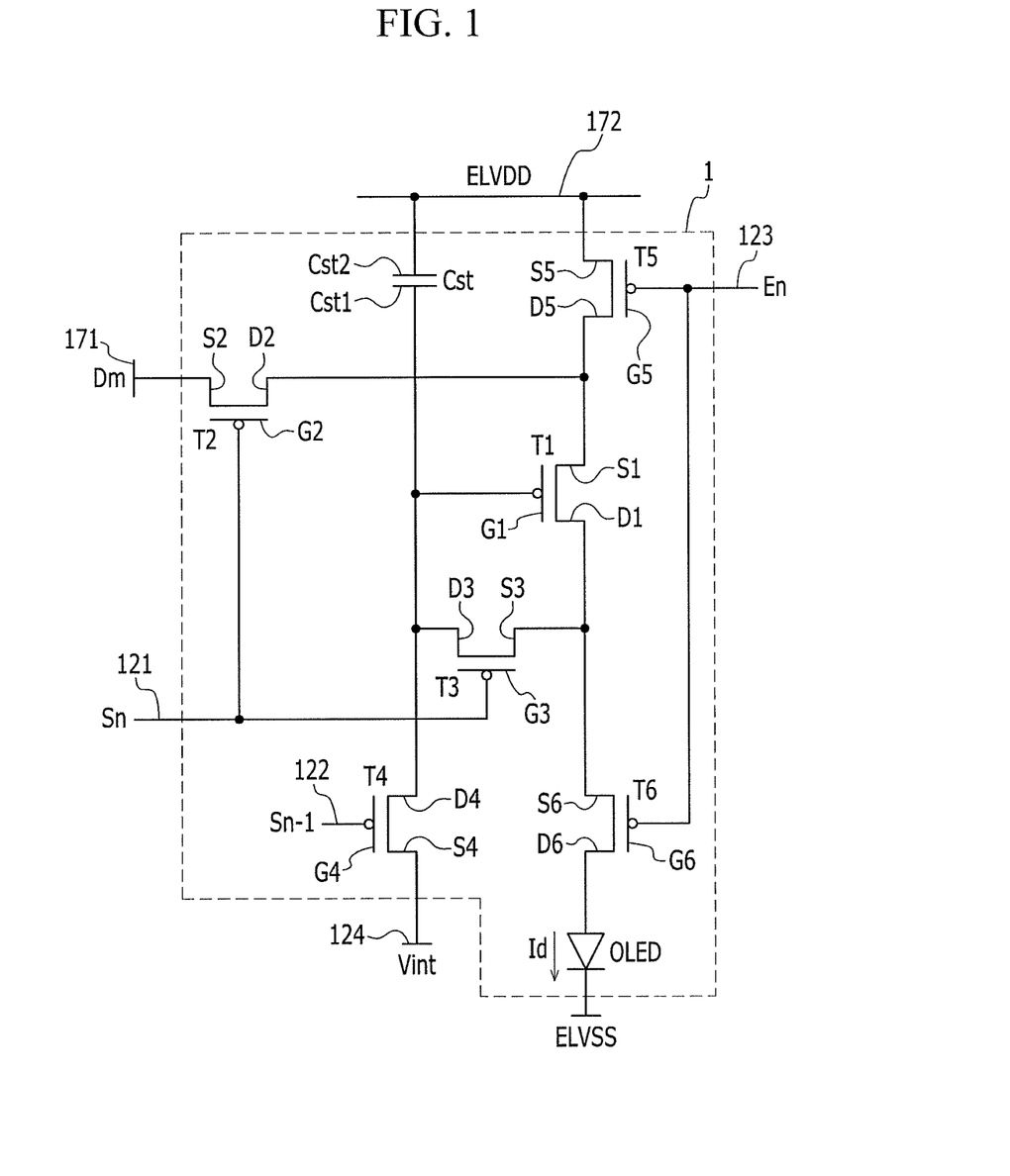
FIG. 1 illustrates a first embodiment of an OLED pixel circuit.

FIG. 1 illustrates a pixel according to one embodiment of an organic light emitting diode display. As illustrated in FIG. 1, the pixel 1 includes a plurality of signal lines 121, 122, 123, 124, 171, and 172, a plurality of transistors T1, T2, T3, T4, T5, and T6, a storage capacitor Cst, and an organic light emitting diode connected to one or more of the plurality of signal lines.

The transistors include a driving transistor (e.g., a thin film transistor) T1, a switching transistor (e.g., a thin film transistor) T2, a compensation transistor T3, an initialization transistor T4, an operation control transistor T5, and a light emission control transistor T6.

The signal lines include a scan line 121 transferring a scan signal Sn, a prior scan line 122 transferring a prior scan signal Sn-1 to the initialization transistor T4, a light emission control line 123 transferring a light emission control signal En to the operation control transistor T5 and the light emission control transistor T6, a data line 171 crossing the scan line 121 and transferring a data signal Dm, a driving voltage line 172 transferring a driving voltage ELVDD and formed in almost parallel to the data line 171, and an initialization voltage line 124 transferring an initialization voltage Vint for initializing the driving transistor T1.

A gate electrode G1 of the driving transistor T1 is connected to a first end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives the data signal Dm according to a switching operation of the switching transistor T2 to supply a driving current Id to the organic light emitting diode (OLED).

A gate electrode G2 of the switching transistor T2 is connected to the scan line 121. A source electrode S2 of the switching transistor T2 is connected to the data line 171. A drain electrode D2 of the switching transistor T2 is connected, via the operation control transistor T5, to the driving voltage line 172 while being connected to the source electrode S1 of the driving transistor T1. The switching transistor T2 is turned on according to the scan signal Sn transferred through the scan line 121 to perform a switching operation for transferring the data signal Dm transferred to the data line 171 to the source electrode of the driving transistor T1.

A gate electrode G3 of the compensation transistor T3 is connected to the scan line 121. A source electrode S3 of the compensation transistor T3 is connected via the light emission control transistor T6 to the anode of the organic light emitting diode (OLED), while being connected to the drain electrode D1 of the driving transistor T1. A drain electrode D3 of the compensation transistor T3 is connected to the first end Cst1 of the storage capacitor Cst, a drain electrode D4 of the initialization transistor T4, and the gate electrode G1 of the driving transistor T1. The compensation transistor T3 is turned on according to the scan signal Sn transferred through the scan line 121, to connect the gate electrode G1 and the drain electrode D1 of the driving transistor T1 to each other, thus performing diode-connection of the driving transistor T1.

The gate electrode G4 of the initialization transistor T4 is connected to the prior scan line 122. The source electrode S4 of the initialization transistor T4 is connected to the initialization voltage line 124. The drain electrode D4 of the initialization transistor T4 is connected to the first end Cst1 of the storage capacitor Cst, the drain electrode D3 of the compensation transistor T3, and the gate electrode G1 of the driving transistor T1. The initialization transistor T4 is turned on according to the prior scan signal Sn-1, transferred through the prior scan line 122, to transfer the initialization voltage Vint to the gate electrode G1 of the driving transistor T1. The initialization transistor T4, thus, is used to perform an initialization operation for initializing the voltage of the gate electrode G1 of the driving transistor T1.

A gate electrode G5 of the operation control transistor T5 is connected to the light emission control line 123. A source electrode S5 of the operation control transistor T5 is connected to the driving voltage line 172. A drain electrode D5 of the operation control transistor T5 is connected to the source electrode S1 of the driving transistor T1 and the drain electrode S2 of the pixel switching transistor T2.

A gate electrode G6 of the light emission control transistor T6 is connected to the light emission control line 123. A source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to the anode of the organic light emitting diode. The operation control transistor T5 and the light emission control transistor T6 are simultaneously turned on, according to the light emission control signal En transferred through the light emission control line 123, to transfer the driving voltage ELVDD to the organic light emitting diode (OLED), thus allowing the driving current Id to flow in the organic light emitting diode (OLED).

A second end Cst2 of the storage capacitor Cst is connected to the driving voltage line 172, and a cathode of the organic light emitting diode (OLED) is connected to a common voltage ELVSS. Accordingly, the organic light emitting diode (OLED) receives a driving current Id from the driving transistor T1 to emit light, thereby displaying an image.

Operation of the pixel will now be described. First, a prior scan signal Sn-1 at a low level is supplied through the prior scan line 122 during an initialization period. Then, the initialization transistor T4 is turned on corresponding to the prior scan signal Sn-1 at the low level. When T4 turns on, the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn at the low level is supplied through the scan line 121 during a data programming period. Then, the pixel switching transistor T2 and the compensation transistor T3 are turned on corresponding to the scan signal Sn at the low level. In this case, the driving transistor T1 is diode-connected by the turned-on compensation transistor T3, and is biased in a forward direction.

Then, a compensation voltage Dm+Vth (e.g., Vth is a negative value), obtained by subtracting a threshold voltage Vth of the driving transistor T1 from the voltage of the data signal Dm supplied from the data line 171, is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Subsequently, the level of the light emission control signal En supplied from the light emission control line 123 during the light emission period is changed from the high level to the low level. Then, the operation control transistor T5 and the light emission control transistor T6 are turned on by the light emission control signal En at the low level during the light emission period.

The driving current Id is then generated according to a difference between the voltage of the gate electrode of the driving transistor T1 and the driving voltage ELVDD, and the driving current Id is supplied through the light emission control transistor T6 to the organic light emitting diode. The gate-source voltage Vgs of the driving transistor T1 is maintained, at (Dm+Vth)−ELVDD, by the storage capacitor Cst during the light emission period. The driving current Id is proportional to a square of a value obtained by subtracting the threshold voltage from the source-gate voltage, that is, $(Dm-ELVDD)^2$, according to a current-voltage relationship of the driving transistor T1. Accordingly, the driving current Id is determined regardless of the threshold voltage Vth of the driving transistor T1.

Figure 2:
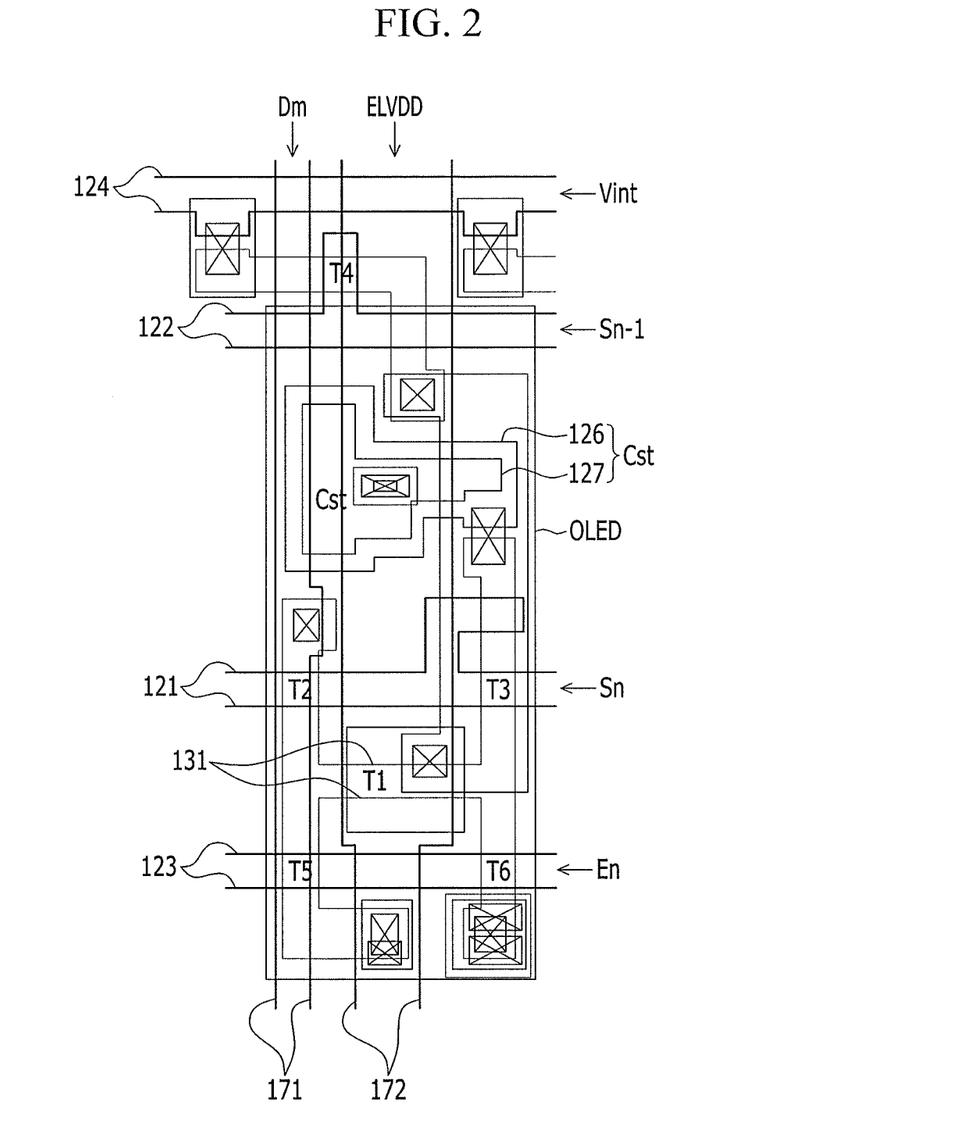
FIG. 2 illustrates transistors and capacitors that may be included in FIG. 1.
Figure 3:
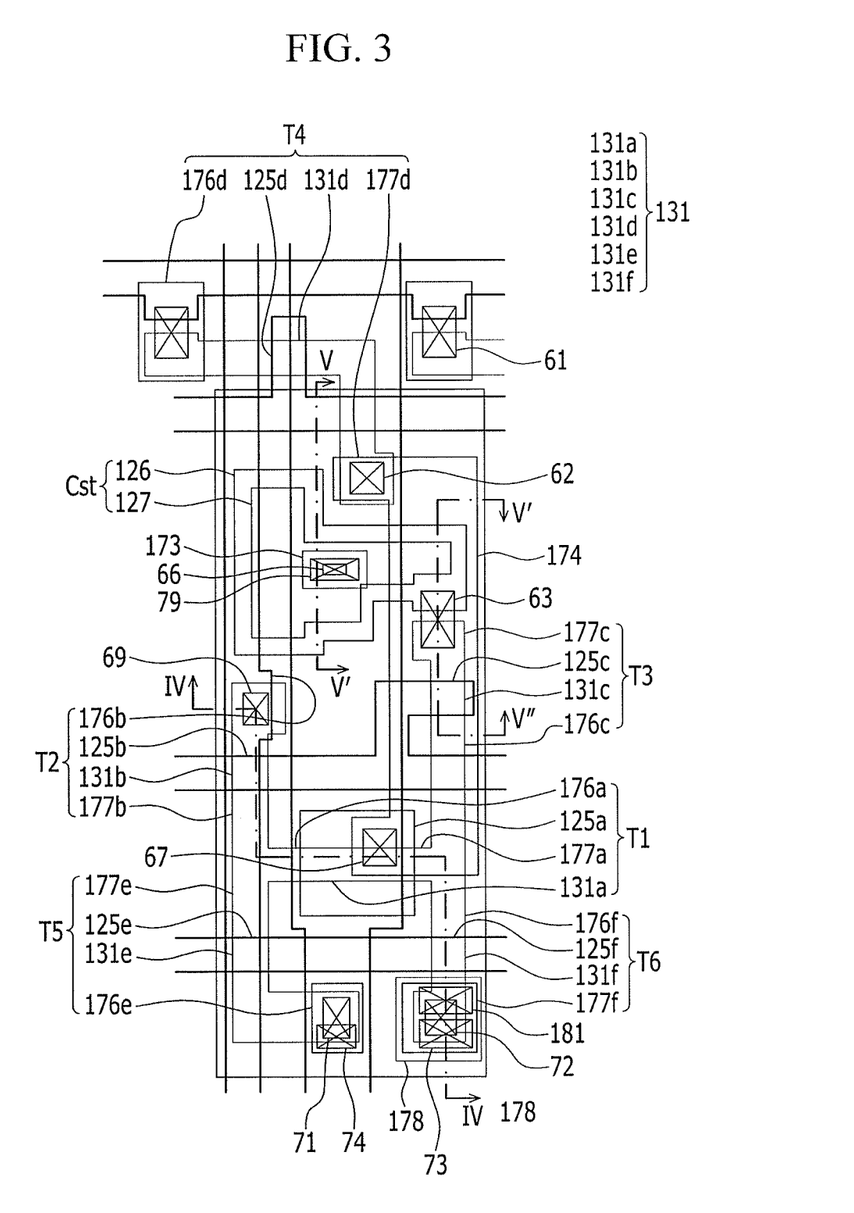
FIG. 3 illustrates an example of a layout of one pixel in FIG. 2.
Figure 4:
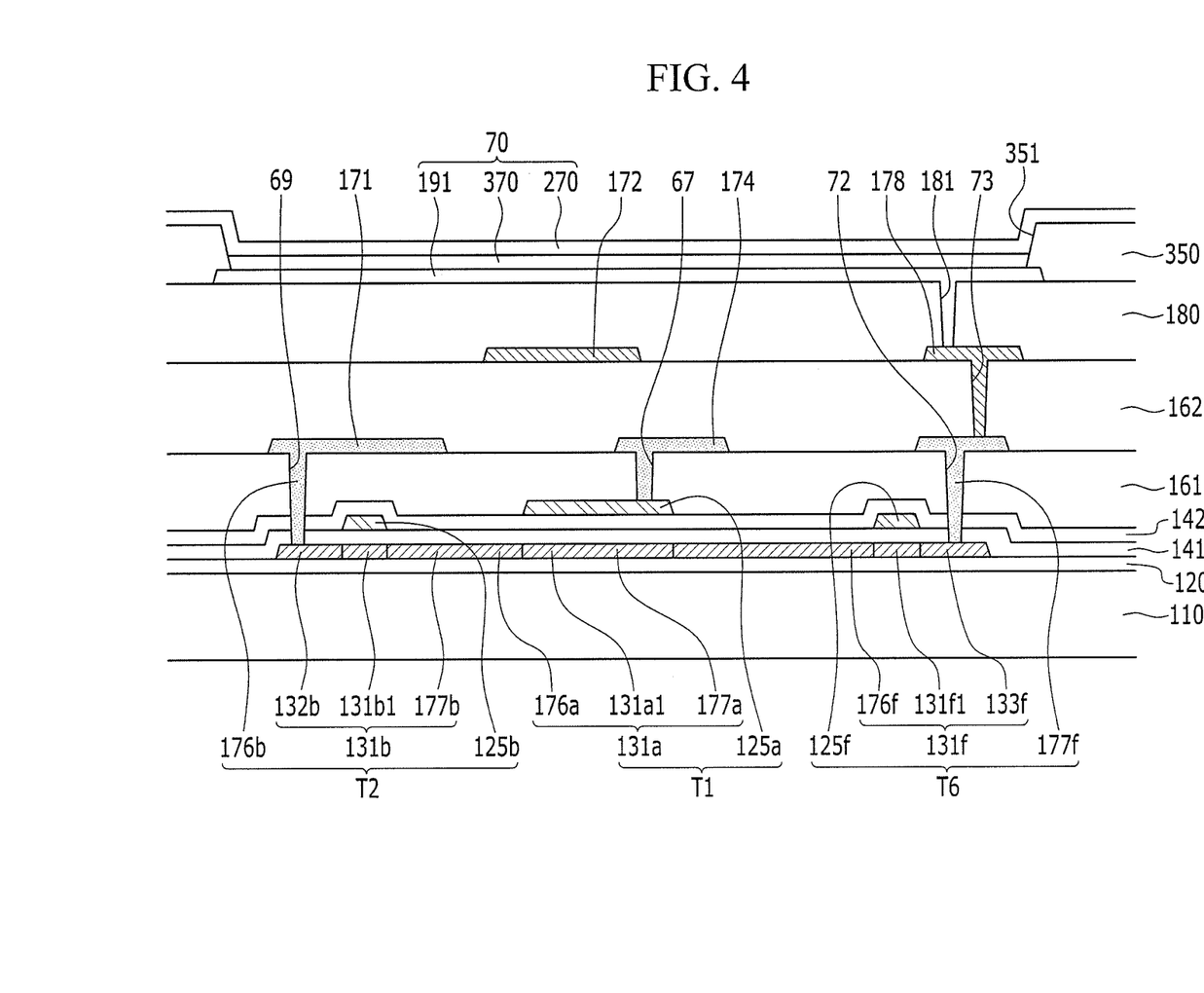
FIG. 4 illustrates a view taken along section line IV-IV in FIG. 3.
Figure 5:
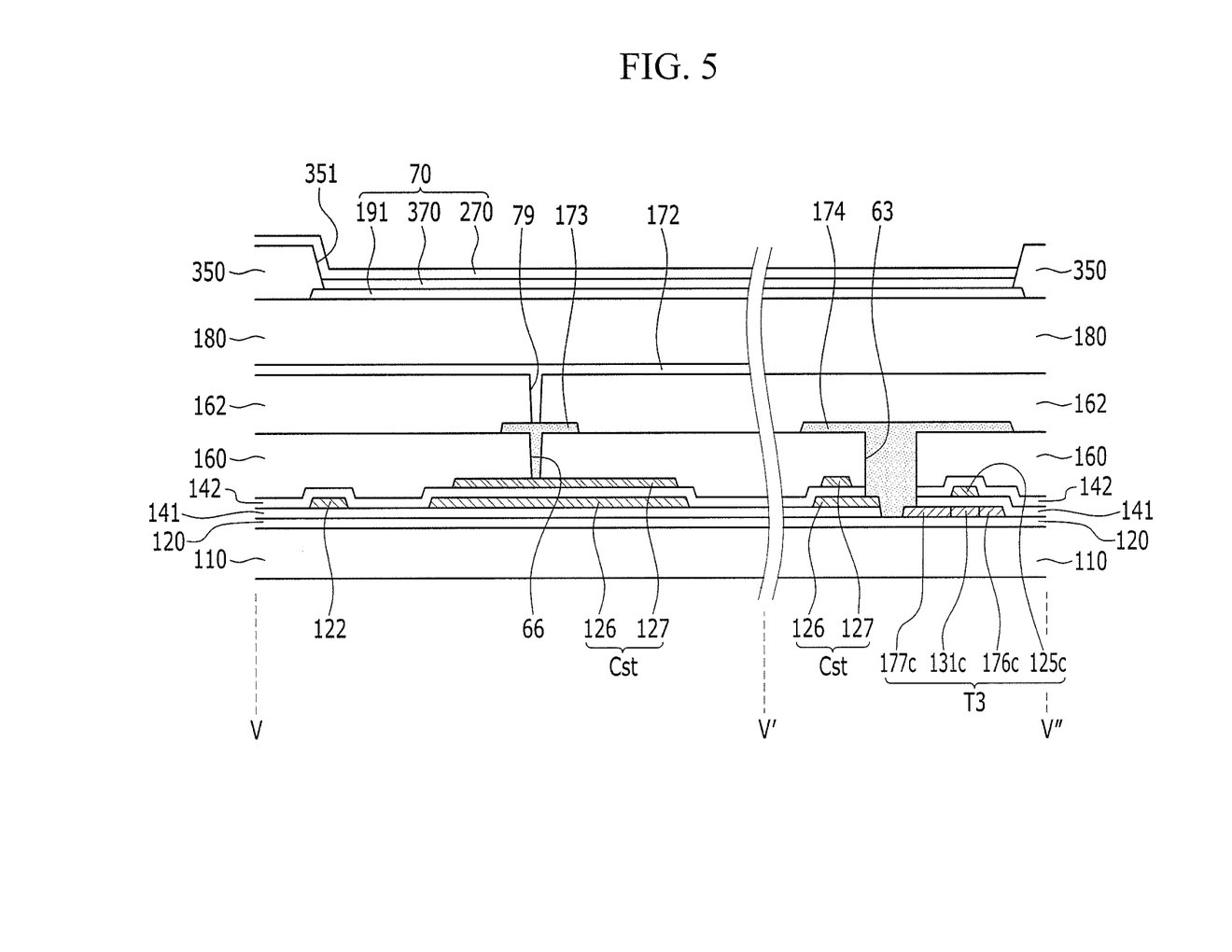
FIG. 5 illustrates a view taken along second lines V-V' and V'-V" in FIG. 3.

FIG. 2 illustrates transistors and capacitors which may be included in the pixel circuit of FIG. 1, FIG. 3 illustrates a more detailed layout of the pixel in FIG. 2, FIG. 4 is a cross-sectional view taken along section line IV-IV in FIG. 3, and FIG. 5 is a cross-sectional view taken along section lines V-V' and V'-V"I FIG. 3.

As shown in these figures, gate electrode G6 of the light emission control transistor T6 is connected to the light emission control line 123. A source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to the anode of the organic light emitting diode (OLED).

Further, the driving transistor T1, the pixel switching transistor T2, the compensation transistor T3, the initialization transistor T4, the operation control transistor T5, the light emission control transistor T6, the storage capacitor Cst, and the organic light emitting diode (OLED) are formed in the pixel circuit.

The driving transistor T1, the pixel switching transistor T2, the compensation transistor T3, the initialization transistor T4, the operation control transistor T5, and the light emission control transistor T6 formed in the pixel circuit are formed along a semiconductor layer 131. The semiconductor layer 131 is formed to be bent in various shapes. The semiconductor layer 131 may be made of polysilicon or an oxide semiconductor.

Examples of the oxide semiconductor include an oxide of any one or more of the following: titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O). When the semiconductor layer 131 is formed of the oxide semiconductor, a separate protective layer may be added to protect the oxide semiconductor, which may be weak to external environment factors such as high temperatures.

The semiconductor layer 131 includes a channel region that is subjected to channel doping with an N-type impurity or a P-type impurity. A source region and a drain region are formed at respective sides of the channel region and may be formed, for example, by doping an impurity of a conductivity type opposite to the conductivity type of the impurity doped in the channel region.

A flat surface structure of the pixel 1 is described with reference to FIGS. 2 and 3, and a cross-sectional structure thereof is described with reference to FIGS. 4 and 5.

As shown in FIGS. 2 and 3, the pixel 1 includes the driving transistor T1, the switching transistor T2, the compensation transistor T3, the initialization transistor T4, the operation control transistor T5, and the light emission control transistor T6. The pixel also includes the storage capacitor Cst and the organic light emitting diode OLED.

The transistors T1, T2, T3, T4, T5, and T6 are formed along the semiconductor layer 131. The semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

The driving transistor T1 includes the driving semiconductor layer 131a, a driving gate electrode 125a, a driving source electrode 176a, and a driving drain electrode 177a. The driving source electrode 176a corresponds to the driving source region 176a doped with an impurity in the driving semiconductor layer 131a. The driving drain electrode 177a corresponds to the driving drain region 177a doped with an impurity in the driving semiconductor layer 131a. The driving gate electrode 125a overlaps the driving semiconductor layer 131a, and the driving gate electrode 125a is formed with the same layer and the same material as a second storage capacitive plate 127 and the initialization voltage line 124.

The switching transistor T2 includes the switching semiconductor layer 131b, a switching gate electrode 125b, a switching source electrode 176b, and a switching drain electrode 177b. The switching source electrode 176b is connected to the data line 171 through a contact hole 69. The switching drain electrode 177b corresponds to the switching drain region 177b doped with an impurity in the switching semiconductor layer 131b.

The switching gate electrode 125b is formed with the same material and the same layer as the scan line 121, the prior scan line 122, the light emission control line 123, a compensation gate electrode 125c, an initialization gate electrode 125d, an operation control gate electrode 125e, the light emission control gate electrode 125f, and a first storage capacitive plate 126.

The compensation transistor T3 includes the compensation semiconductor layer 131c, the compensation gate electrode 125c, a compensation source electrode 176c, and a compensation drain electrode 177c. The compensation source electrode 176c corresponds to the compensation source region 176c doped with an impurity in the compensation semiconductor layer 131c. The compensation drain electrode 177c corresponds to the compensation drain region 177c doped with an impurity.

The initialization transistor T4 includes the initialization semiconductor layer 131d, the initialization gate electrode 125d, an initialization source electrode 176d, and an initialization drain electrode 177d. The initialization source electrode 176d is simultaneously connected to the initialization voltage line 124 and the initialization semiconductor layer 131d through a contact hole 61. The initialization drain electrode 177d as another end of a connection member 174 is connected to the initialization semiconductor layer 131d through a contact hole 62.

The operation control transistor T5 includes the operation control semiconductor layer 131e, the operation control gate electrode 125e, an operation control source electrode 176e, and an operation control drain electrode 177e. The operation control source electrode 176e is connected to the operation control semiconductor layer 131e through a contact hole 71. The operation control drain electrode 177e corresponds to the operation control drain region 177e doped with an impurity in the operation control semiconductor layer 131e.

The light emission control transistor T6 includes the light emission control semiconductor layer 131f, a light emission control gate electrode 125f, a light emission control source electrode 176f, and a light emission control drain electrode 177f. The light emission control source electrode 176f corresponds to the light emission control source region 176f doped with an impurity in the light emission control semiconductor layer 131f.

One end of the driving semiconductor layer 131a of the driving transistor T1 is connected to the switching semiconductor layer 131b and the compensation semiconductor layer 131c. Another end of the driving semiconductor layer 131a is connected to the operation control semiconductor layer 131e and the light emission control semiconductor layer 131f. Therefore, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes the first storage capacitive plate 126 and the second storage capacitive plate 127, with a second gate insulating layer 142 interposed therebetween. The first storage capacitive plate 126 is formed with the same material and the same layer as the scan line 121, the prior scan line 122, the light emission control line 123, the switching gate electrode 125b, the compensation gate electrode 125c, the initialization gate electrode 125d, the operation control gate electrode 125e, and the light emission control gate electrode 125f. The second storage capacitive plate 127 is formed with the same material and the same layer as the driving gate electrode 125a and the initialization voltage line 124.

The second gate insulating layer 142 may be a dielectric material, and storage capacitance is determined by charges accumulated in the storage capacitor Cst and a voltage between both capacitive plates 126 and 127.

The second gate insulating layer 141 may include, for example, a high dielectric constant material. The high dielectric constant material may be one selected from HfOx, ZrOx, AlOx, and SiOx. By forming the second gate insulating layer 141 made of the high dielectric constant material, the storage capacitance of the storage capacitor Cst may be improved.

The driving voltage line 172, which overlaps and passes the storage capacitor Cst, overlaps and passes the scan line 121, the prior scan line 122, the light emission control line 123, and the initialization voltage line 124. A portion of the driving voltage line 172 is connected to the operation control source electrode 176e through a contact hole 74. The operation control source electrode 176e is connected to the operation control semiconductor layer 131e through the contact hole 71. The other portion of the driving voltage line 172 is connected to a storage connection plate 173 through a contact hole 79. The storage connection plate 173 is connected to the storage capacitive plate 127 through a contact hole 66.

A connection member 174 parallel to the driving voltage line 172 is formed with the same layer as the data line 171. One end of the connection member 174 is connected to the driving gate electrode 125a through a contact hole 67. A center portion of the connection member 174 is connected to the first storage capacitive plate 126 through a contact hole 63, such that the connection member 174 connects the driving gate electrode 125a and the first storage capacitive plate 126. Accordingly, the storage capacitor Cst stores the storage capacitance corresponding to the difference between the driving voltage ELVDD transmitted to the second storage capacitive plate 127 through the driving voltage line 172 and the gate voltage of the driving gate electrode 125a.

The switching transistor T2 is used as a switching diode for selecting a pixel that is to emit light. The switching gate electrode 125b is connected to the scan line 121, the switching source electrode 176b is connected to the data line 171, and the switching drain electrode 177b is connected to the driving transistor T1 and the operation control transistor T5. The light emission control drain electrode 177f of the light emission control transistor T6 is connected to a light emission control connection plate 178 through a contact hole 73 formed in the second interlayer insulating layer 162. The light emission control connection plate 178 is directly connected to a pixel electrode 191 of a light emitting diode 70 through a contact hole 181 formed in a protective layer 180.

Referring to FIGS. 4 and 5, a structure of one embodiment of a pixel included in an organic light emitting diode display includes the driving transistor T1, the switching transistor T2, and the light emission control transistor T6. In this structure, the compensation transistor T3 and the initialization transistor T4 may have almost the same deposition structure as the switching transistor T2, and the operation control transistor T5 may have almost the same lamination structure as the light emission control transistor T6.

A buffer layer 120 is formed on a substrate 110, and the substrate 110 is formed of an insulating substrate made of glass, quartz, ceramics, plastics, or the like.

The driving semiconductor layer 131a, the switching semiconductor layer 131b, and the light emission control semiconductor layer 131f are formed on buffer layer 120. The driving semiconductor layer 131a includes a driving channel region 131a1, and the driving source region 176a and driving drain region 177a facing each other with the driving channel region 131a1 therebetween. The switching semiconductor layer 131b includes a switching channel region 131b1, and the switching source region 132b and switching drain region 177b facing each other with the switching channel region 131b1 therebetween. The light emission control transistor T6 includes a light emission control channel region 131f1, the light emission control source region 176f, and a light emission control drain region 133f.

A first gate insulating layer 141 is formed on the switching semiconductor layer 131a, the driving semiconductor layer 131b, and the light emission control semiconductor layer 131f. The first gate insulating layer 141 may be formed of, for example, silicon nitride (SiNx) or silicon oxide (SiO2).

The first gate wires 121, 122, 123, 125b, 125f, and 126, including the scan line 121 and the switching gate electrode 125b, the prior scan line 122, the light emission control line 123 including the light emission control gate electrode 125f, and the first storage capacitive plate 126, are formed on the first gate insulating layer 141.

The second gate insulating layer 142 is formed on the first gate wires 121, 122, 123, 125b, 125f, and 126 and the first gate insulating layer 141. The second gate insulating layer 142 is formed of the high dielectric constant material such as HfOx, ZrOx, AlOx, and SiOx.

The second gate wires 125a, 124, and 127, including the driving gate electrode 125a, the initialization voltage line 124, and the second storage capacitive plate 127, are formed on the second gate insulating layer 142.

As described above, the first gate insulating layer 141 and the second gate insulating layer 142 are formed between the driving semiconductor layer 131a and the driving gate electrode 125a. These layers serve to increase an interval between the driving semiconductor layer 131a and the driving gate electrode 125a. Increasing this interval, in turn, allows for an increase in the driving range of the gate voltage applied to the driving gate electrode 125a, which allows for an enhanced grayscale range to be realized for displaying an image. Also, the second gate insulating layer 142 is formed of the high dielectric constant material, which allows for an improvement in the storage capacitance of the storage capacitor Cst.

A first interlayer insulating layer 161 is formed on the second gate wires 125a, 124, and 127 and the second gate insulating layer 142.

The first data wires 171, 174, 177d, 176e, and 177f, including the data line 171 including the switching source electrode 176b, the storage connection plate 173, the connection member 174, the initialization drain electrode 177d, the operation control source electrode 176e, and the light emission control drain electrode 177f, is formed on the first interlayer insulating layer 161. The light emission control drain electrode 177f is connected to the light emission control drain region 133f of the light emission control semiconductor layer 131f through a contact hole 72 formed in the first gate insulating layer 141, the second gate insulating layer 142, and the first interlayer insulating layer 161.

A second interlayer insulating layer 162 is formed on the first interlayer insulating layer 161 and the first data wires 171, 174, 177d, 176e, and 177f. The first interlayer insulating layer 161 and the second interlayer insulating layer 162 may be formed, for example, by using a ceramic-based material such as silicon nitride (SiNx) or silicon oxide (SiO2).

Second data wires 172 and 178 including the driving voltage line 172 and the light emission control connection plate 178 is formed on the second interlayer insulating layer 162. The light emission control connection plate 178 is connected to the light emission control drain electrode 177f through the contact hole 73 formed in the second interlayer insulating layer 162.

By forming the data line 171 and the driving voltage line 172 in the above-described manner, the data line 171 and the driving voltage line 172 may overlap to to allow the inner space of the pixel to be minimized, thereby minimizing the pixel size while simultaneously realizing a high resolution display.

The protective layer 180 covering the second data wires 172 and 178 is formed on the second interlayer insulating layer 162 and a pixel electrode 191 is formed on the protective layer 180. The pixel electrode 191 is connected to the light emission control connection plate 178 through the contact hole 181 formed in the protective layer 180.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of resins such as polyacrylates and polyimides or silica-based inorganic materials.

An organic emission layer 370 is formed on the pixel electrode 191 exposed through the barrier rib opening 351, and a common electrode 270 is formed on the organic emission layer 370. The organic light emitting diode 70 including the pixel electrode 191, the organic emission layer 370, and the common electrode 270 is formed as described above.

The pixel electrode 191 may be an anode that is a hole injection electrode, and the common electrode 270 may be a cathode that is an electron injection electrode. In other embodiments, the pixel electrode 191 may be the cathode and the common electrode 270 may be the anode. Holes and electrons are injected from the pixel electrode 191 and the common electrode 270 into the organic emission layer 370. Excitons form when the injected holes and electrons bond to each other. When the excitons fall from an exited state to a ground state, light is emitted.

The organic emission layer 370 is formed of a low molecular weight organic material or a high molecular weight organic material such as PEDOT (poly(3,4-ethylenedioxythiophene)). Further, the organic emission layer 370 may be formed of multiple layers including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 191 that is the anode, and the hole transport layer HTL, the emission layer, the electron transport layer ETL, and the electron injection layer EIL are sequentially laminated thereon.

The organic emission layer 370 may include a red organic emission layer emitting light having a red color, a green organic emission layer emitting light having a green color, and a blue organic emission layer emitting light having a blue color. The red organic emission layer, the green organic emission layer, and the blue organic emission layer are respectively formed in a red pixel, a green pixel, and a blue pixel to implement a color image.

In one embodiment, the organic emission layer 370 may implement the color image by laminating all of the red organic emission layer, the green organic emission layer, and the blue organic emission layer in the red pixel, the green pixel, and the blue pixel together, and forming a red color filter, a green color filter, and a blue color filter for each pixel.

In another embodiment, a white organic emission layer emitting light having a white color may be formed in all of the red pixel, the green pixel, and the blue pixel, and the red color filter, the green color filter, and the blue color filter may be formed for each pixel to implement the color image. In the case where the color image is implemented by using the white organic emission layer and the color filter, deposition masks for depositing the red organic emission layer, the green organic emission layer, and the blue organic emission layer on each pixel, that is, the red pixel, the green pixel, and the blue pixel, may not be used.

In another embodiment, the white organic emission layer may be formed of one organic emission layer, and may even include a constitution in which a plurality of organic emission layers are laminated to emit light having the white color. Such a constitution may include one in which at least one yellow organic emission layer and at least one blue organic emission layer are combined to emit light having the white color, a constitution in which at least one cyan organic emission layer and at least one red organic emission layer are combined to emit light having the white color, a constitution in which at least one magenta organic emission layer and at least one green organic emission layer are combined to emit light having the white color.

A sealing member for protecting the organic light emitting diode 70 may be formed on the common electrode 270, may be sealed by a sealant on the substrate 110, and may be formed of various materials such as glass, quartz, ceramic, plastics, and metal. A sealing thin film layer may be formed by depositing an inorganic layer and an organic layer on the common electrode 270 while not using the sealant.

Further, in one embodiment, the storage capacitor may be formed by using the second storage capacitive plate formed with the different layer from the data line. However, in another embodiment, the storage capacitor may be formed using a second storage capacitor plate made from a same layer as the data line.

Figure 6:
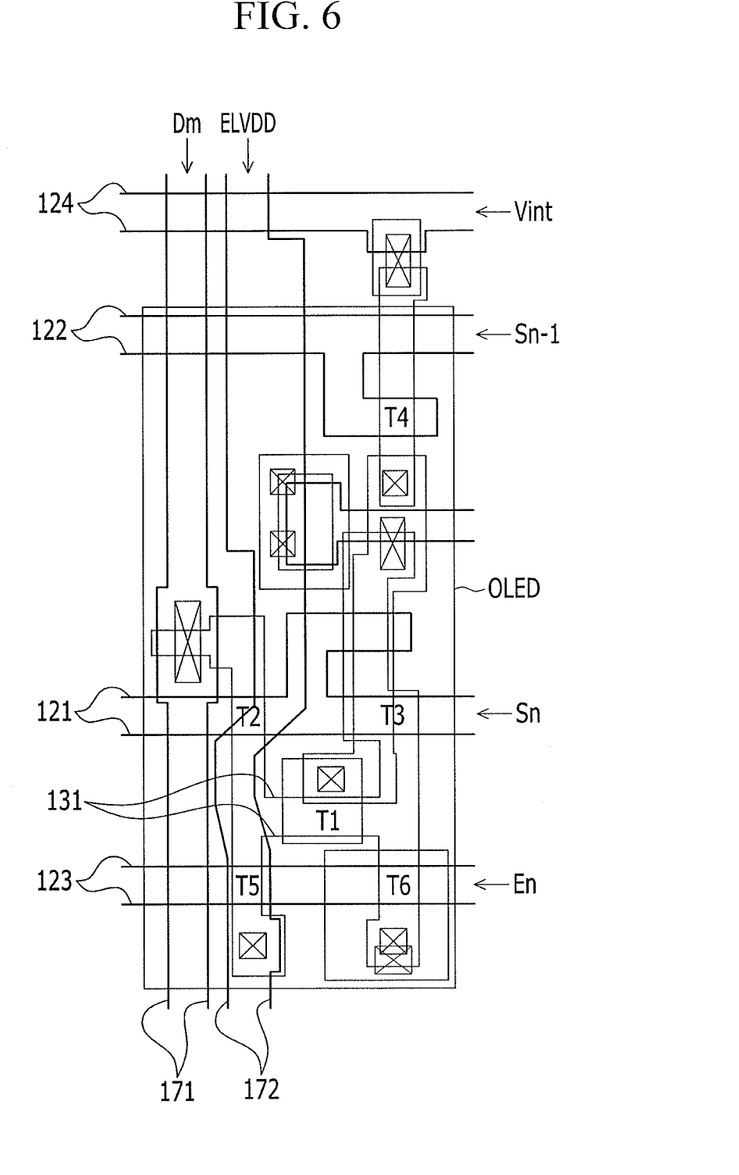
FIG. 6 illustrates a second embodiment of an OLED pixel circuit.
Figure 7:
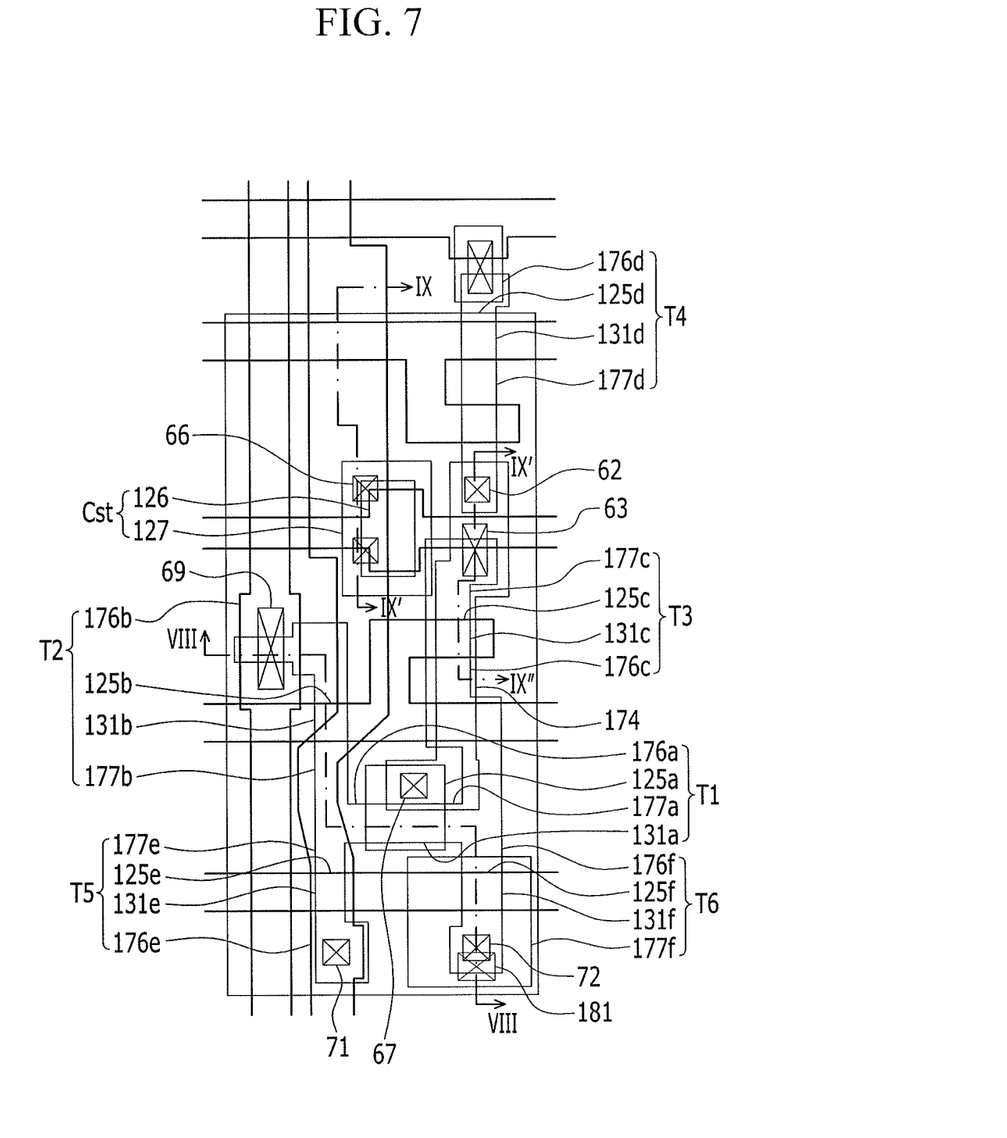
FIG. 7 illustrates an example of a layout of one pixel of FIG. 6.
Figure 8:
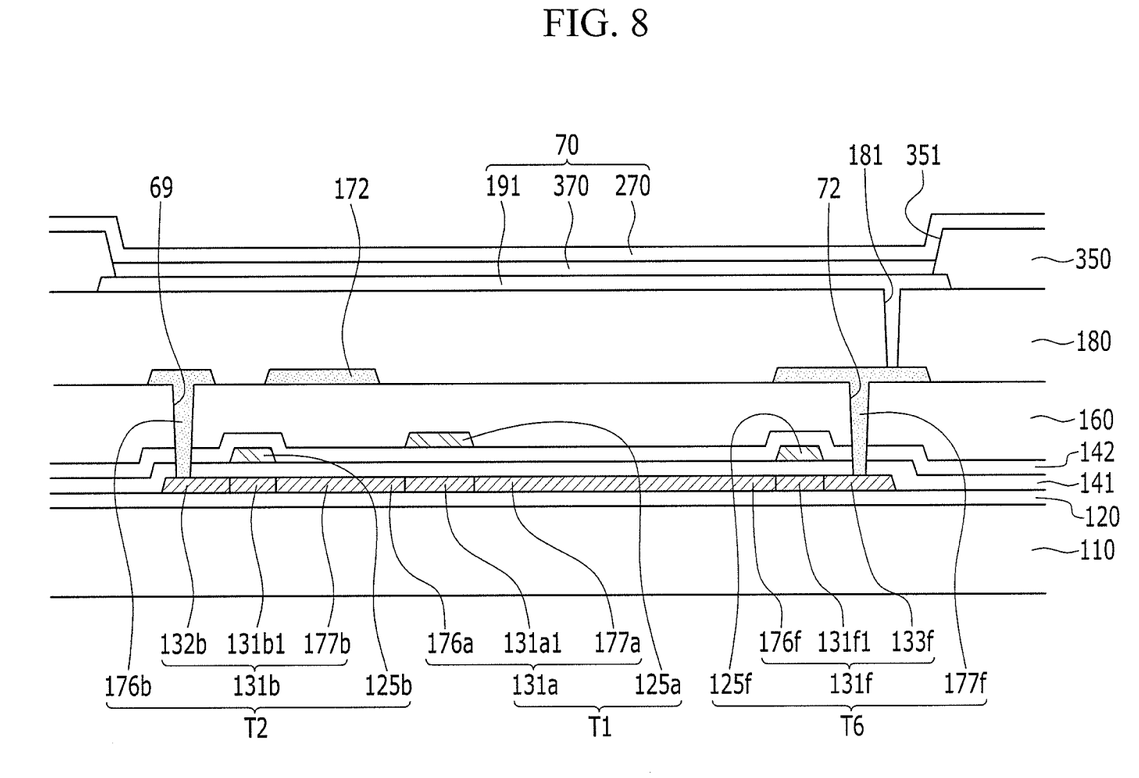
FIG. 8 illustrates a view taken along section line VIII-VIII in FIG. 7.
Figure 9:
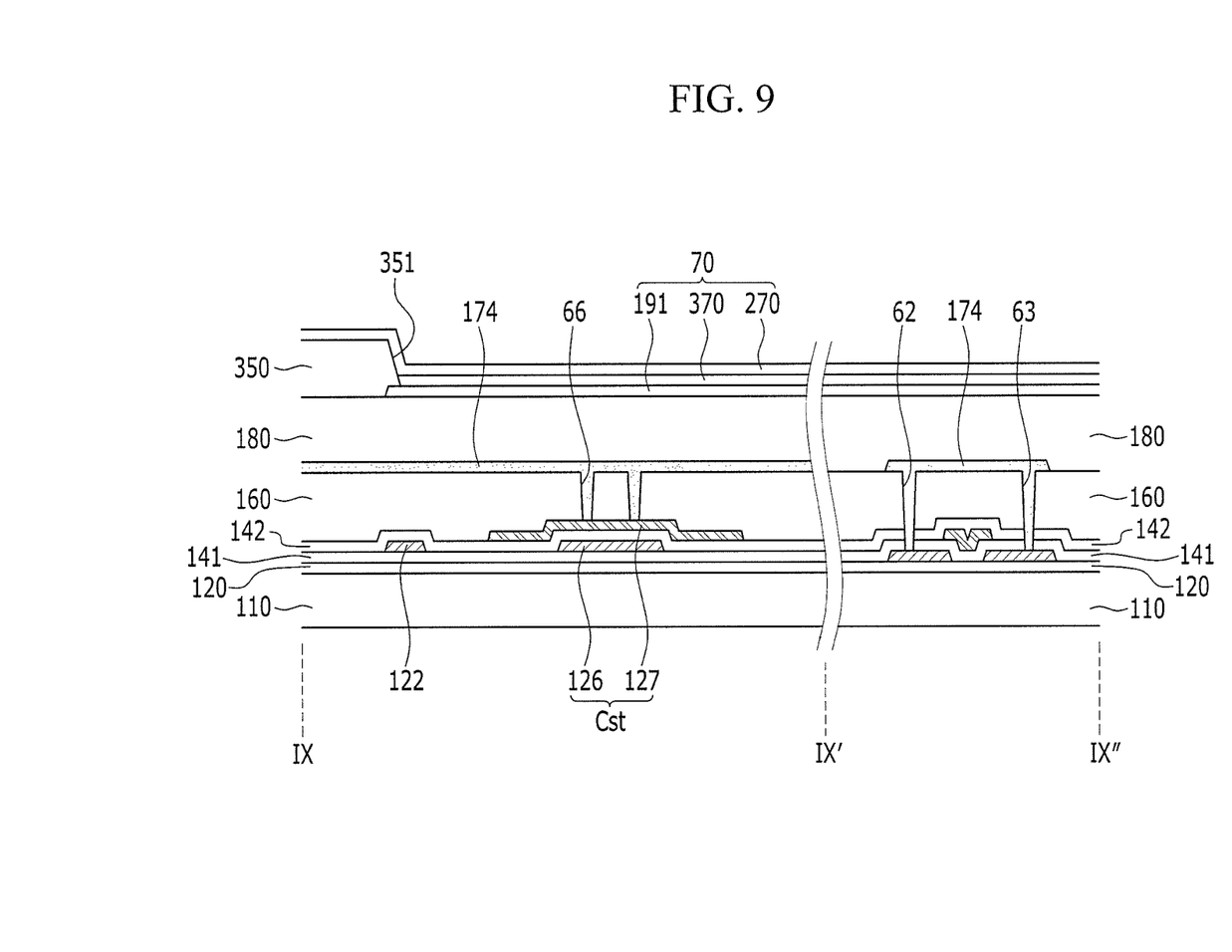
FIG. 9 illustrates a view taken along section lines IX-IX' and IX'-IX" in FIG. 7.

An organic light emitting diode display according to a second embodiment is described with reference to FIG. 6 to FIG. 9. FIG. 6 illustrates a view of a plurality of transistors and capacitors of the display. FIG. 7 illustrates a view of one pixel in FIG. 6. FIG. 8 is a cross-sectional view taken along section line VIII-VIII in FIG. 7. FIG. 9 is a cross-sectional view taken along section lines IX-IX' and IX'-IX" in FIG. 7. The second embodiment is similar to the first embodiment shown in FIGS. 1 to 5 except for a position of the second storage capacitive plate.

As shown in FIG. 6 and FIG. 7, the driving gate electrode 125*a* of the organic light emitting diode (OLED) display according to the second exemplary embodiment is formed with the same material and the same layer as the data line 171 and the second storage capacitive plate 127.

The switching gate electrode 125*b* may be formed with the same material and the same layer as the scan line 121, the prior scan line 122, the light emission control line 123, the initialization voltage line 124, the compensation gate electrode 125*c*, the initialization gate electrode 125*d*, the operation control gate electrode 125*e*, the light emission control gate electrode 125*f*, and the first storage capacitive plate 126.

The initialization source electrode 176*d* is simultaneously connected to the initialization voltage line 124 and the initialization semiconductor layer 131*d* through the contact hole 61. The initialization drain electrode 177*d* is connected to the connection member 174 through the contact hole 62. The connection member 174 is connected to the compensation drain electrode 177*c* through the contact hole 63.

The operation control source electrode 176*e* is a portion of the driving voltage line 172 and is connected to the operation control semiconductor layer 131*e* through the contact hole 71.

The storage capacitor Cst includes the first storage capacitive plate 126 and the second storage capacitive plate 127 disposed via the second gate insulating layer 142. The first storage capacitive plate 126 is formed with the same material and the same layer as the switching gate electrode 125*b*, and the second storage capacitive plate 127 is formed with the same material and the same layer as the driving gate electrode 125*a*.

The second gate insulating layer 142 includes the high dielectric constant material, and is one selected from HfOx, ZrOx, AlOx, and SiOx. As described above, by forming the second gate insulating layer 142 made of the high dielectric constant material, the storage capacitance of the storage capacitor Cst may be improved.

Also, a portion of the driving voltage line 172 corresponds to the operation control source electrode 176*e* and is connected to the operation control semiconductor layer 131*e* through the contact hole 71. The other portion of the driving voltage line 172 is connected to the second storage capacitive plate 127 through the contact hole 66.

A connection member 174 is formed parallel to the driving voltage line 172 with the same layer as the driving voltage line 172. One end of the connection member 174 is connected to the driving gate electrode 125*a* through the contact hole 67, and another end of the connection member 174 is connected to the first storage capacitive plate 126 through the contact hole 63. The connection member 174 is connected to the driving gate electrode 125*a* and the first storage capacitive plate 126. Accordingly, the storage capacitor Cst has a storage capacitance corresponding to a difference between the driving voltage ELVDD transmitted through the driving voltage line 172 and the gate voltage of the driving gate electrode 125*a*.

Referring to FIGS. 8 and 9, the driving semiconductor layer 131*a*, the switching semiconductor layer 131*b*, and the light emission control semiconductor layer 131*f* are formed on the buffer layer 120. The first gate insulating layer 141 is formed on the switching semiconductor layer 131*a*, the driving semiconductor layer 131*b*, and the light emission control semiconductor layer 131*f*. The first gate insulating layer 141 is formed, for example, of silicon nitride (SiNx) or silicon oxide (SiO2).

The first gate wires 121, 122, 123, 124, 125*b*, 125*f*, and 126, including the scan line 121 including the switching gate electrode 125*b*, the prior scan line 122, the light emission control line 123 including the light emission control gate electrode 125*f*, the initialization voltage line 124, and the first storage capacitive plate 126, are formed on the first gate insulating layer 141.

The second gate insulating layer 142 is formed on the first gate wires 121, 122, 123, 124, 125*b*, 125*f*, and 126 and the first gate insulating layer 141. The second gate insulating layer 142 is formed of the high dielectric constant material such as HfOx, ZrOx, AlOx, and SiOx.

The second gate wires 125*a*, 127, and 171 including the driving gate electrode 125*a*, the second storage capacitive plate 127, and the data line 171 are formed on the second gate insulating layer 142.

As described above, the first gate insulating layer 141 and the second gate insulating layer 142 are formed between the driving semiconductor layer 131a and the driving gate electrode 125a such that the interval between the driving semiconductor layer 131a and the driving gate electrode 125a is increased. Accordingly, the driving range of the gate voltage applied to the driving gate electrode 125a is broadened to display a greater range of grayscale values. Also, the second gate insulating layer 142 is formed of the high dielectric constant material to improve the storage capacitance of the storage capacitor Cst.

The interlayer insulating layer 160 is formed on the second gate wires 125a, 127, and 171 and the second gate insulating layer 142. The data wires 172, 174, 176e, and 177f, including the driving voltage line 172 including the operation control source electrode 176e, the connection member 174, and the light emission control drain electrode 177f, are formed on the interlayer insulating layer 160.

As described above, by forming the data line 171 with the same layer as the driving gate electrode 125a, the data line 171 is formed with the different layer from the driving voltage line 172 such that the data line 171 and the driving voltage line 172 may overlap, thereby realizing the high resolution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display comprising:
a substrate;
a scan line on the substrate to transmit a scan signal;
a data line and a driving voltage line crossing the scan line, the data line and driving voltage line to respectively transmit a data signal and a driving voltage;
a switching transistor connected to the scan line and the data line and including a semiconductor layer, a gate electrode, and a drain electrode;
a driving transistor connected to the drain electrode of the switching transistor and including a semiconductor layer and a gate electrode;
a first interlayer insulating layer over the gate electrode of the driving transistor;
a second interlayer insulating layer over the data line formed on the first interlayer insulating layer; and
an organic light emitting diode connected to the drain electrode of the driving transistor, wherein the data line and the driving voltage line are at different layers, wherein the data line and the gate electrode of the driving transistor are at different layers, and wherein the driving voltage line is over the second interlayer insulating layer.

2. The display as claimed in claim 1, wherein the gate electrode of the driving transistor and the gate electrode of the switching transistor are at different layers.

3. The display as claimed in claim 2, further comprising:
a first gate insulating layer over the semiconductor layers of the driving and switching transistors; and
a second gate insulating layer on the first gate insulating layer and over the gate electrode of the switching transistor, wherein the gate electrode of the driving transistor is on the second gate insulating layer.

4. The display as claimed in claim 3, further comprising a storage capacitor including a first plate formed of a same layer as the gate electrode of the switching transistor and a second plate on the second gate insulating layer over the first plate, wherein the driving voltage line is connected to the second plate.

5. The display as claimed in claim 4, wherein the second gate insulating layer includes a high dielectric constant material.

6. The display as claimed in claim 5, wherein the second gate insulating layer includes one of hafnium oxide, zirconium oxide, aluminum oxide, or silicon oxide.

7. The display as claimed in claim 6, wherein the second plate is formed of a same material and is of a same layer as the gate electrode of the driving transistor.

8. An organic light emitting diode (OLED) display comprising:
a substrate;
a scan line on the substrate to transmit a scan signal;
a data line and a driving voltage line crossing the scan line, the data line and driving voltage line to respectively transmit a data signal and a driving voltage;
a switching transistor connected to the scan line and the data line and including a semiconductor layer and a gate electrode and a drain electrode;
a driving transistor connected to the drain electrode of the switching transistor and including a semiconductor layer and a gate electrode;
an interlayer insulating layer over the gate electrode of the driving transistor and the data line; and
an organic light emitting diode connected to the drain electrode of the driving transistor, wherein the data line and the driving voltage line are at different layers, wherein the data line and the driving gate electrode are at a same layer, wherein the driving voltage line is over the interlayer insulating layer.

9. The display as claimed in claim 8, wherein the gate electrode of the driving transistor is at a different layer from the gate electrode of the switching transistor.

10. The display as claimed in claim 9, further comprising:
a first gate insulating layer over a semiconductor layer including the semiconductor layers of the switching and driving transistors; and
a second gate insulating layer on the first gate insulating layer and over the gate electrode of the switching transistor, wherein the gate electrode of the driving transistor is on the second gate insulating layer.

11. The display as claimed in claim 10, further comprising a storage capacitor including a first plate formed of a same layer as the gate electrode of the switching transistor and a second plate on the second gate insulating layer over the first plate, wherein the driving voltage line is connected to the second plate.

12. The display as claimed in claim 11, wherein the second gate insulating layer includes a high dielectric constant material.

13. The display as claimed in claim 12, wherein the second gate insulating layer includes one of hafnium oxide, zirconium oxide, aluminum oxide, or silicon oxide.

14. The display as claimed in claim 13, wherein the second plate is formed of a same material and is of a same layer as the gate electrode of the driving transistor.

15. The display as claimed in claim 1, wherein:
- the data line is coupled to a first surface of the second interlayer insulating layer,
- the driving voltage line is coupled to a second surface of the second interlayer insulating layer, and
- the first and second surfaces are opposing surfaces.

16. The display as claimed in claim 1, wherein the gate electrode of the driving transistor at least partially overlaps the driving voltage line.

17. The display as claimed in claim 1, further comprising:
- a first gate insulating layer; and
- a second gate insulating layer adjacent the first gate insulating layer,
- wherein the first and second gate insulating layers are between the semiconductor layer and the gate electrode of the driving transistor, wherein the first gate insulating layer is between the gate electrode and the semiconductor layer of the switching transistor, and wherein the second gate insulating layer is over the gate electrode of the switching transistor.

* * * * *